US007867405B2

(12) United States Patent
Spitz et al.

(10) Patent No.: US 7,867,405 B2
(45) Date of Patent: Jan. 11, 2011

(54) PROCESS FOR PRODUCING MICROFLUIDIC ARRANGEMENTS FROM A PLATE-SHAPED COMPOSITE STRUCTURE

(75) Inventors: Michael Spitz, Hemer (DE); Holger Reinecke, Emmendingen (DE)

(73) Assignee: Boehringer Ingelheim Pharma GmbH & Co. KG, Ingelheim am Rhein (DE)

( * ) Notice: Subject to any disclaimer, the term of this patent is extended or adjusted under 35 U.S.C. 154(b) by 1003 days.

(21) Appl. No.: 10/564,545

(22) PCT Filed: Jul. 13, 2004

(86) PCT No.: PCT/EP2004/007715

§ 371 (c)(1),
(2), (4) Date: Feb. 13, 2007

(87) PCT Pub. No.: WO2005/014175

PCT Pub. Date: Feb. 17, 2005

(65) Prior Publication Data

US 2007/0210029 A1 Sep. 13, 2007

(30) Foreign Application Priority Data

Jul. 16, 2003 (DE) ................................ 103 32 426
Jul. 16, 2003 (DE) ................................ 103 32 434

(51) Int. Cl.
*H01L 13/00* (2006.01)

(52) U.S. Cl. ................................ 216/17; 216/2; 216/18; 216/27

(58) Field of Classification Search ..................... 216/2, 216/17, 18, 27, 39; 156/345.17
See application file for complete search history.

(56) References Cited

U.S. PATENT DOCUMENTS

| | | | | |
|---|---|---|---|---|
| 5,547,094 | A | 8/1996 | Bartels et al. | |
| 5,666,947 | A * | 9/1997 | McKay | 128/200.21 |
| 5,911,851 | A * | 6/1999 | Bartels et al. | 156/345.21 |
| 5,964,416 | A | 10/1999 | Jaeger et al. | |
| 2008/0203196 | A1* | 8/2008 | Laidler et al. | 239/553.5 |

FOREIGN PATENT DOCUMENTS

| | | | |
|---|---|---|---|
| DE | 4236037 | A1 | 4/1994 |
| GB | 1187976 | | 4/1970 |
| GB | 1273741 | | 5/1972 |
| WO | 9114468 | A1 | 10/1991 |
| WO | 9407607 | A1 | 4/1994 |
| WO | 9712687 | A1 | 4/1997 |
| WO | 9916530 | A1 | 4/1999 |

* cited by examiner

*Primary Examiner*—Lan Vinh
(74) *Attorney, Agent, or Firm*—Roberts Mlotkowski Safran & Cole, P.C.; David S. Safran

(57) ABSTRACT

A process for producing a multiplicity of microfluidic arrangements from a plate-shaped composite structure and an atomiser which is provided with such nozzle arrangements is proposed. Each arrangement has a groove structure which forms flow channels and the dimensions of which are in the micrometer range. The lines for optional subsequent mechanical separation of bridging groove structures are joined to each other and are partly or completely filled with a filling medium before mechanical machining. The medium is selected so that it is not removed from the groove structures either by the mechanical machining or by aids used during mechanical machining. Afterwards, however, the filling medium is removed from the groove structures by suitable measures. The groove structures are thereby prevented from becoming blocked due to mechanical contaminants.

15 Claims, 7 Drawing Sheets

PROCESS FOR PRODUCING MICROFLUIDIC ARRANGEMENTS FROM A PLATE-SHAPED COMPOSITE STRUCTURE

BACKGROUND OF THE INVENTION

1. Field of the Invention

This invention relates to a process for producing a multiplicity of microfluidic arrangements, particularly nozzle arrangements, from a plate-shaped composite structure comprising groove structures with dimensions in the micrometer range and to an atomiser comprising a nozzle arrangement of this type.

2. Description of Related Art

A process of the type to which the present invention is directed is known from U.S. Pat. No. 5,547,094.

Nozzle arrangements of the type in question are employed for atomising liquid into very fine droplets by pressing the liquids under a high pressure through a nozzle opening of small cross-section. Amongst their other applications, nozzle arrangements of this type are employed in the medical field for aerosols for inhalation purposes, for example. Stringent demands with regard to droplet size are made on a nozzle arrangement of the type in question, since for inhalation applications, for example, a sufficiently large proportion of the droplets should have a diameter less than 6 μm in order to enter the lungs satisfactorily. In general, particles or droplets with a diameter less than 10 μm are considered as being respirateble.

U.S. Pat. No. 5,547,094 relates exclusively to block-like nozzle arrangements for applications of this type, and to methods of producing large numbers of block-like nozzle arrangements such as these of consistently high quality. With this known process, it is also possible to incorporate a filter, or even multi-stage filters, in the nozzle arrangement.

The overall content of the disclosure of U.S. Pat. No. 5,547,094 is made part of the disclosure of the present patent application by reference thereto. All the process steps of a corresponding production process which are disclosed there, and all the material specifications which are disclosed there, as well as the tools which are used, etc., can also be used within the scope of the process according to the present invention. Further disclosure regarding these nozzle arrangements can be found in International Patent Application Publications WO 94/07607 A1 and WO 99/16530 A1.

The known process firstly involves the production of a plate-shaped composite structure which comprises two plates with intrinsically planar surfaces which are fixedly and two-dimensionally joined to each other. Further plates can also optionally be added. It is essential that the nozzle arrangements in the plate-shaped composite structure are created by providing a multiplicity of recurring groove structures, each of which corresponds to a nozzle arrangement, in an intrinsically planar surface of one of the plates which is joined to the intrinsically planar surface of the other plate. The groove structures can optionally also be disposed in both the mutually facing surfaces of the two plates which are relevant here and which are joined to each other. In the prior art, a particularly preferred combination is a composite of a silicon plate and a glass plate, wherein other variants are also mentioned.

The groove structures ultimately form the flow channels of the nozzle arrangements, which preferably have dimensions in the micrometer range. To give an idea of the order of magnitude of the groove structures, the prior art mentions structure heights between 2 and 40 μm, preferably between 5 and 7 μm, and cross-sectional areas of the nozzles between about 25 and about 500 $\mu m^2$.

Separate nozzle arrangements are obtained from the plate-shaped composite structure comprising a multiplicity of nozzle arrangements by separating the plate-like composite structure, by mechanical machining, along parting lines which extend between two groove structures. Nozzle arrangements of small surface area, which were formerly block-like, then exist separately. According to the prior art, separation by mechanical machining is effected in particular by sawing with a circular saw, preferably with a diamond circular saw which is operated at high speed. Nicking and breaking of larger plate-shaped composite structures are also cited as an alternative, for example. Both these machining steps can also be combined with each other, namely sawing can be carried out in first step, followed by completion in a second step by breaking or by separation by laser beam.

With regard to the production of the composite structure, reference is made in particular to field-assisted bonding, and also to other joining techniques including adhesive bonding, ultrasonic bonding, etc.

With this process, which is thus assumed to be known, for the production of nozzle arrangements from a plate-shaped composite structure comprising groove structures which have dimensions in the micrometer range, the problem arises that the groove structures are contaminated during mechanical machining, particularly by sawing. A liquid cooling lubricant, particularly one based on water, is normally used during mechanical machining. Due to this, and due to the swarf entrained therein, under some circumstances, the groove structures become blocked so that, in practice, they can no longer be cleaned. The consequence is a high reject rate. In this respect, it should be taken into consideration that several hundred individual nozzle arrangements are firstly formed on a plate-shaped composite structure and these are then separated by a grid-like network of parting lines. The individual production of nozzle arrangements of this type is therefore completely inconceivable.

The problem disclosed above is not only applicable to the production of a multiplicity of block-like, separate nozzle arrangements from a plate-shaped composite structure to which the aforementioned prior art relates, but is also applicable to the manufacture of a multiplicity of microfluidic arrangements comprising corresponding groove structures from a plate-shaped composite structure in general. Apart from nozzle arrangements, this problem arises for other microfluidic arrangements which have no direct nozzle function, for example, filter arrangements or distribution arrangements.

For microfluidic arrangements in general, the plate-shaped composite structure is preferably mechanically machined along lines which extend between the groove structures and which are not necessarily parting lines, so that thereafter the microfluidic arrangements in the composite structure are individually separated or are separated into groups but are not completely separated, or are in fact individually separated but are completely separated into groups.

SUMMARY OF THE INVENTION

The present invention is directed to solving the aforementioned problem for such microfluidic arrangements in general, and particularly nozzle arrangements.

According to the invention, the groove structures are filled before mechanical machining with a filling medium which is not removed again from the groove structures until after mechanical machining. The groove structures are thus reliably prevented from becoming contaminated by swarf and/or cooling lubricant during mechanical machining. The groove structures remain protected and are not exposed again until the operation is complete. The reject rate of the microfluidic arrangements is thus low, because contaminants are systematically prevented from reaching the groove structures.

The groove structures are filled either completely or only partially such that at least openings of the groove structures that are exposed to the exterior or mechanical machining are blocked by the filling medium so that the groove structures can not be contaminated by swarf, cooling lubricant or the like during mechanical machining of the composite structure. It is not important regarding the protection against contamination whether the interior or inside portions of the groove structures are filled with the filling medium as well or not, as long as all openings or connections to the exterior are closed or blocked by the filling medium during mechanical machining.

In detail, various options exist for designing and further developing the process according to the invention, and reference is made to the subsidiary claims in this respect.

The invention, and embodiments and further developments thereof, are explained in more detail in the description given below of examples of embodiments with reference to the drawings.

DETAILED DESCRIPTION OF THE INVENTION

Figure 1:
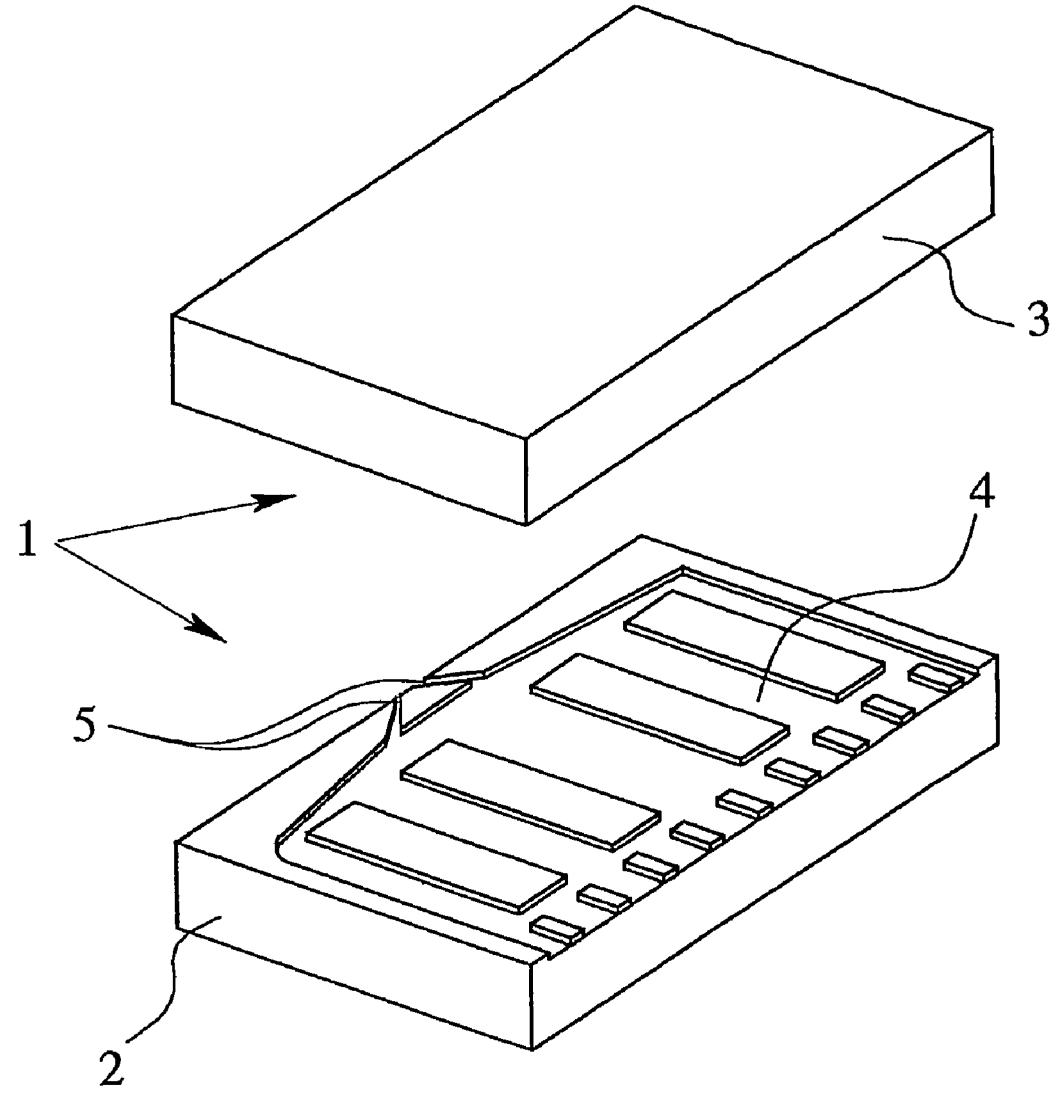
FIG. 1 is an exploded perspective view of a microfluidic arrangement according to the present invention.

FIG. 1 shows an arrangement 1, which is a nozzle arrangement here and which is separated into groups, formed of a lower plate-shaped part 2 and of a part 3 which is also plate-shaped and which is disposed on the lower part 2 and is fixedly joined thereto. According to a preferred embodiment, the lower part 2 is made of silicon. The prior art mentioned at the outset also discloses a whole series of other materials, however. In a preferred embodiment, the upper part 3 is made of glass, but in this respect also the prior art discloses other alternatives, e.g., silicon, silicon nitride or germanium. The separated nozzle arrangement 1 illustrated in FIG. 1 has overall dimensions of 2.0 mm×2.5 mm×1.5 mm. A nozzle arrangement such as this is manufactured in a clean room of the appropriate classification.

Figure 2A:
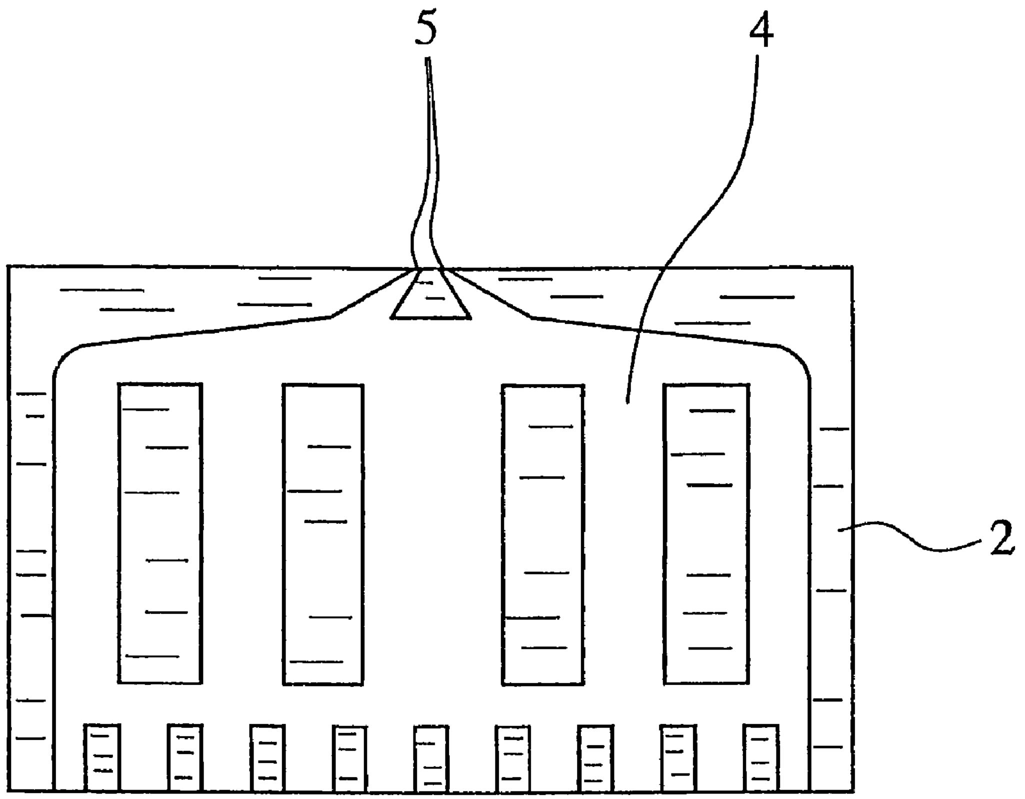
FIG. 2*a* is a plan view of a lower part of the microfluidic arrangement of FIG. 1, showing the groove structure.
Figure 2B:
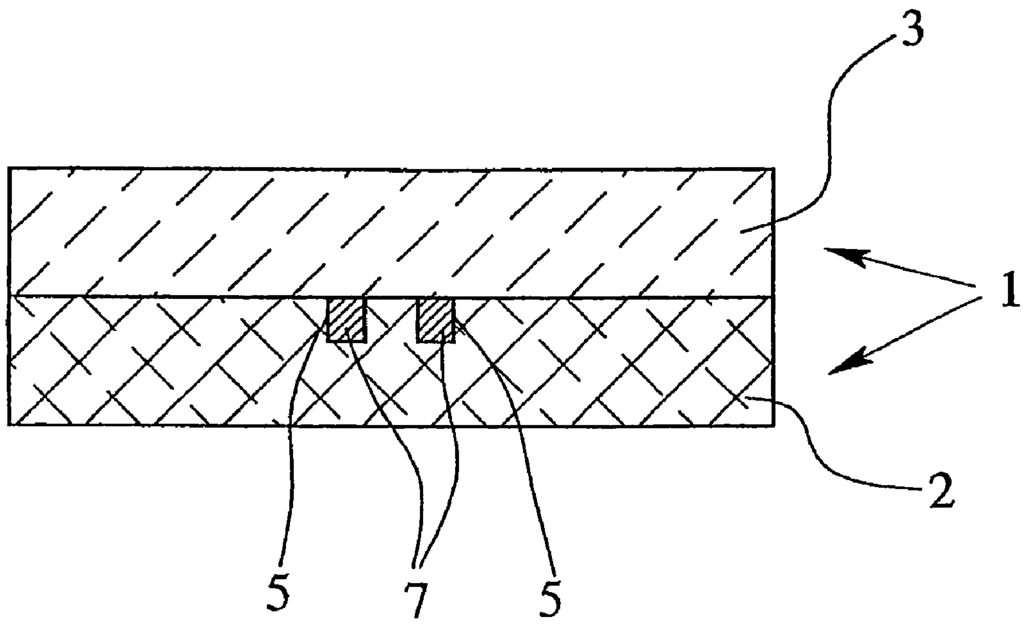
FIG. 2*b* is a section through the microfluidic arrangement of FIG. 1, showing the composite structure.
Figure 3:
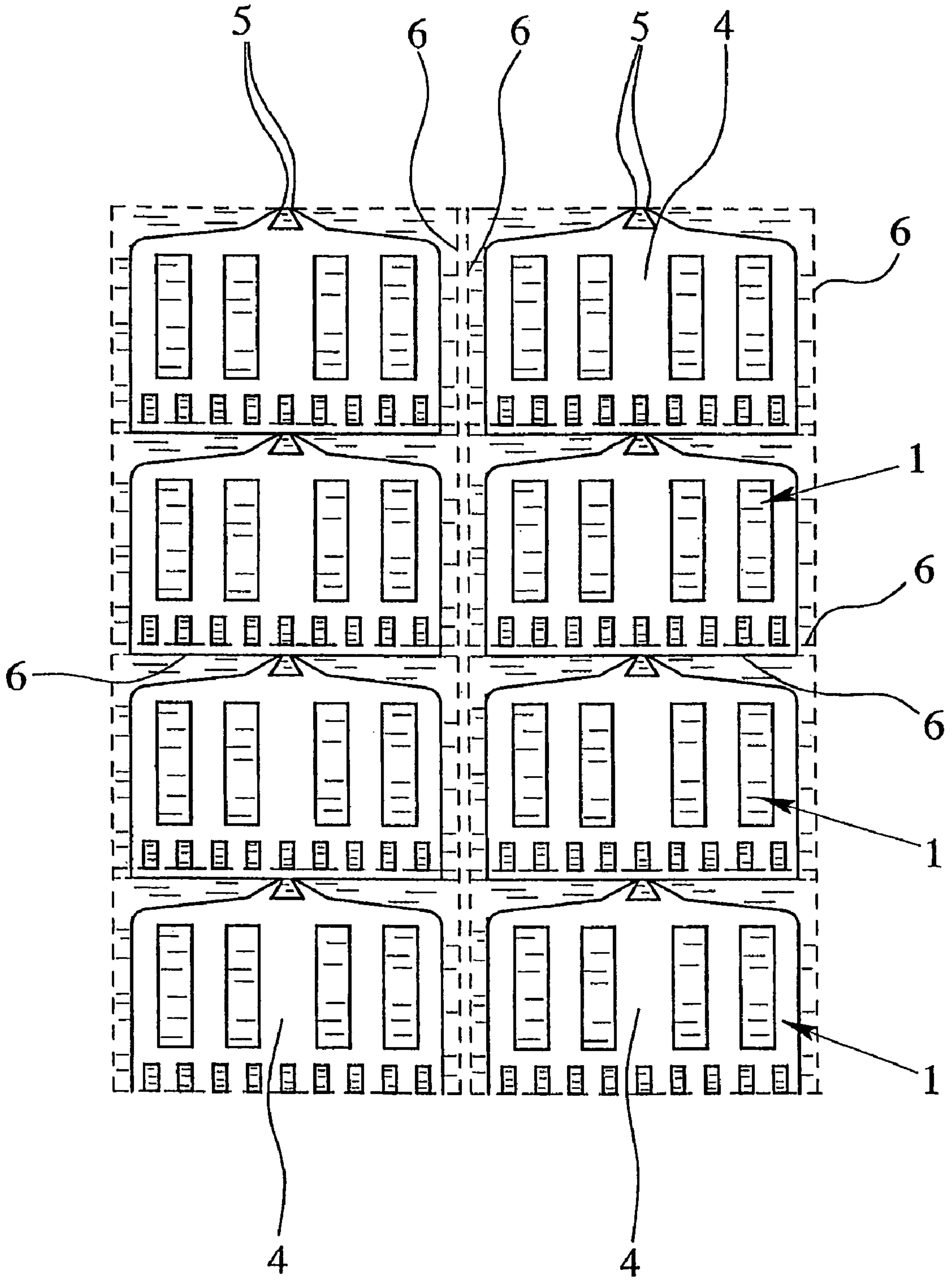
FIG. 3 is a plan view of a portion of a plate-shaped composite structure comprising a plurality of microfluidic arrangements according to FIG. 1.

FIG. 1 shows the arrangement 1 according to a first embodiment as an exploded drawing, namely with the upper part 3 lifted off. FIG. 2*a* is a plan view of the lower part 2. FIG. 2*b* is a section through the individual arrangement 1 in its assembled or finished state. FIG. 3 is a plan view of a plate-shaped composite structure from which a plurality of arrangements 1 comprising groove structures 4 are produced.

Figure 2C:
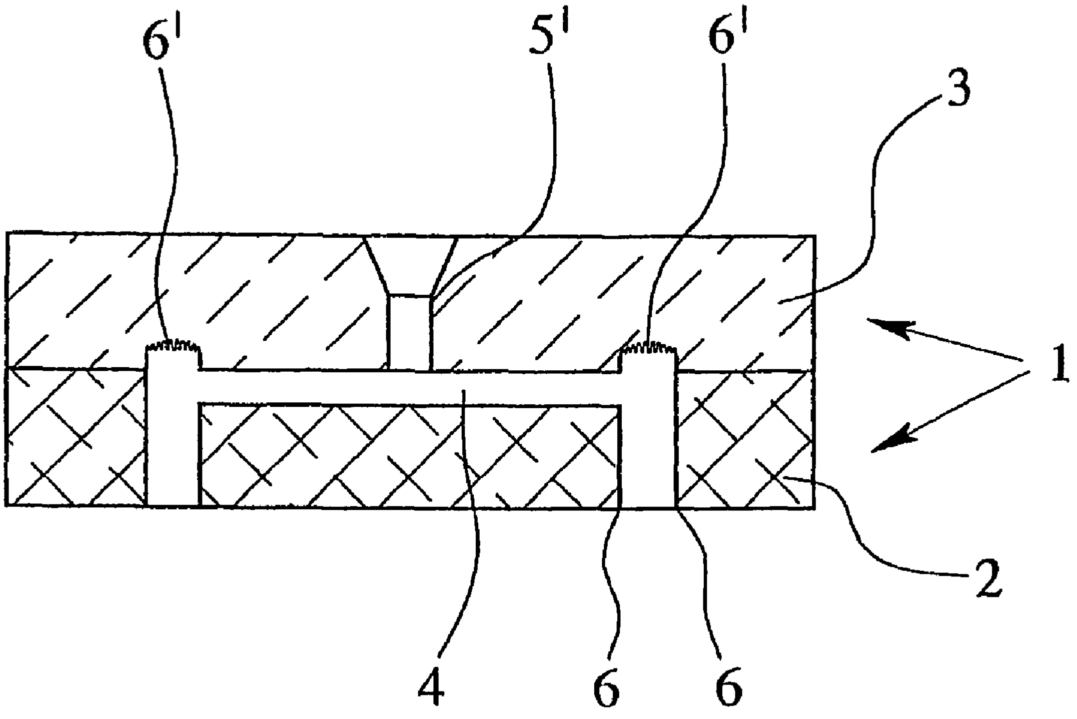
FIG. 2*c* is a section through another microfluidic arrangement, showing the composite structure and the position of the groove structure.

FIG. 2*c* is a section, corresponding to that of FIG. 2*b*, through an arrangement 1 according to a second embodiment.

The layer sequence of the arrangement 1, which is shown in FIGS. 2*b* & 2*c*, corresponds to the layer sequence of the overall plate-shaped composite structure which was present at the start of this manufacturing step (see FIG. 3). The composite structure comprises two plates which are fixedly and two-dimensionally joined to each other and from which the plate-shaped parts 2, 3 of the arrangement 1, which is optionally separated into groups, are subsequently formed. The plates have generally planar surfaces, wherein a multiplicity of recurring groove structures 4, which form flow channels, are disposed in a surface of at least one of the plates, which is joined to the surface of the other plate. These groove structures each form an actual nozzle 5 (FIG. 1), or correspond thereto (FIG. 2*b* or 2*c*). FIG. 3 shows the groove structures for the individual arrangements 1 which in FIG. 3 are still joined to each other overall on the plate-shaped composite structure.

There is a broad spectrum of available options for the design of the nozzle 5 and of the groove structures 4, some of which have already been disclosed in the aforementioned prior art according to U.S. Pat. No. 5,547,094, which also discloses corresponding production processes, such as photolithography and etching techniques. With regard to filter structures which are used, reference is made to International Patent Application Publication WO 99/16530 A1, the disclosure of which is also made part of the disclosure of the present patent application.

From the plate-shaped composite structure of FIG. 3, an individual arrangement 1 like that shown in the perspective view of FIG. 1 is obtained by separating the plate-shaped composite structure by mechanical machining along lines 6, which extend between each two groove structures 4 and which are shown by the broken lines in FIG. 3, so that thereafter the block-like nozzle arrangements 1 exist separately. FIG. 3 shows the grid network of lines 6 which intersect each other at right-angles and which each surrounds an arrangement 1. An exact separation of the arrangement 1, with simultaneous exposure of the corresponding nozzle 5, or of the opposite end of the groove structure 4, or of the inlet of a corresponding filter structure, is effected by sawing with a high-speed (often higher than 20,000 rpm) diamond circular saw, for example, exactly along these lines 6 or more precisely between two such lines 6.

It is obvious that the lines 6 do not have to be physically present or do not have to be made visible by marks. The lines 6 are merely imaginary aids to show where the tool, particularly the saw, needs to be guided over the plate-shaped composite structure. This is affected as such robotically with corresponding software.

As has already been stated above, separation can also be effected in a plurality of steps, wherein at least one separation step is affected by mechanical machining, which results in the aforementioned contamination due to the swarf which is formed and/or to any aids which are used.

For the first embodiment, which is illustrated in FIGS. 1, 2*a*, 2*b* and 3, the nozzle 5 is shown in the section of FIG. 2. A double nozzle is employed here which directs the two fluid jets on to each other so that they impinge on each other at a certain distance from the nozzle 5 and mutually disintegrate each other. This results in the desired distribution of droplet sizes.

FIGS. 2*b* and 2*c* are sections through the composite structure which is the focal point of the present invention. This is employed for producing a multiplicity of microfluidic arrangements 1 which do not necessarily have to be nozzle arrangements.

In the second embodiment shown in FIG. 2*c*, the aforementioned nozzle 5 is in the form of a nozzle channel 5' which extends in the upper part 3, which according to the preferred teaching is made of glass, perpendicularly to the principal plane of the upper part 3, and the lower end of which, which faces the lower part 2, and leads into the groove structure 4 of the surface there. Therefore, this arrangement can be used to achieve orthogonal flow through the microfluidic arrangement 1 as seen from the outside, in contrast to the lateral flow in the example according to the first embodiment which was described above.

The groove structure 4 of the microfluidic arrangement 1 is obtained by a mechanically machining the plate-shaped composite structure along lines 6 which extend between each of the groove structures 4 so that a thereafter the microfluidic arrangements 1 in the composite structure are individually separated or separated into groups but are not completely separated, or are separated completely into groups but only exist separately within each group.

In detail, FIG. 2*c* shows that grooves 6' (between two lines 6) are introduced for this purpose into the composite structure by mechanical machining along the lines 6. These grooves cut through one plate, which is the lower plate 2 in FIG. 2 *c*, namely the plate 2 which comprises the groove structures 4, and do not cut through the other plate, which is the upper plate 3 in the embodiment exemplified, but merely form a channel there which is closed at the base.

The necessity, which is essential to the teaching of the invention, of protecting the groove structures 4 during mechanical machining exists irrespectively of how or where these groove structures 4 are formed in the plate-shaped composite structure.

The description of the production process according to the invention which is given below explains this with reference to a lateral arrangement structure of the groove structures 4 in the plate-shaped composite structure. For the orthogonal arrangement structure which is illustrated in FIG. 2*c*, nothing is changed in the production process according to the invention, and these considerations can be applied correspondingly.

The production process according to the invention relates to a portion of the overall production process for microfluidic arrangements 1 of the type in question. It commences on the already existing plate-shaped composite structure comprising a multiplicity of arrangements 1 and is firstly distinguished in that the groove structures 4 of the plate-shaped composite structure are produced so that they are continuously joined to each other in at least one direction via the lines 6, from one edge to the opposite edge of the plate-shaped composite structure. This can be seen in FIG. 3, which shows a portion of a composite structure which in practice is very much larger, of course. In the embodiment illustrated, the groove structures 4 are continuously joined to each other from bottom to top. Between the outlet of the nozzle 5 of one groove structure 4 and the inlet of the groove structure 4 situated above it, there is a transverse channel situated between the lines 6, which joins the groove structure 4 situated on top, over the entire width thereof, to the nozzle 5 of the groove structure 4 situated underneath.

According to the invention, the groove structures 4 of the plate-shaped composite structure are then filled with a filling medium before mechanical machining. This filling with a filling medium is affected without problems because the groove structures 4 have been joined, as mentioned above. However, the filling medium has to be selected so that it is not removed from the groove structures 4 either by mechanical machining as such or by any aids which may possibly be used during mechanical machining. As has already been explained in the general part of the description, the groove structures 4 are thus protected from the ingress of contaminants during mechanical machining. After mechanical machining is complete, the filling medium is then removed from the groove structures 4 again. The latter are available, in their initial state and without contaminants, for further processing steps.

As an alternative or in addition to filling from bottom to top (or lengthwise), the transverse channel or another formation extending from left to right (in FIG. 3) may be used for the filling medium. Provided, that the transverse channels have a respective width, this could result in that only the transverse channels and the openings of the groove structures 4 have to be filled with a filling medium. With this only partial filling, the filling medium can be removed easier from the groove structures 4 after the mechanical machining of the composite structure.

The results of the process steps explained above could be seen in FIG. 2*c* as the grooves 6' which are introduced there and which produce the groove structure 4 from the underside of the lower part 2, and which thus ultimately make the nozzle channel 5' in the upper part accessible. It is conceivable that microfluidic arrangements 1 of this type can be used as a row for a multiple nozzle arrangement or for more extensive multi-channel microfluidic processes.

The result of the process steps described above is an arrangement 1 which then exists in particular in the form of a block or as a small plate in the form of a composite, as shown in FIGS. 1 and 2. For the first embodiment, the two outlets of the nozzle 5 are shown in FIG. 2*b* on a somewhat exaggerated scale and filled with the filling medium, wherein numeral 7 designates the filling medium.

It should be understood that the process according to the invention is preferably carried out using clean room technology, where an appropriate class of clean room processing should be selected.

The choice of filling medium is particularly important to the process according to the invention. In this connection, it has to be taken into account that the dimensions of the groove structures 4, which are in the micrometer range, necessitate special filling techniques. Capillary effects, and the effects of surface tension and viscosity, have consequences here which are quite different from those observed for larger nozzle arrangements of macroscopic dimensions. Moreover, the technique involving the freezing out of water, which is known from macroscopic processes, is irrelevant here.

The first important property of the filling medium is that it is immiscible with, and is not dissolved by, any cooling lubricant which is used. At least, these effects should be slight in order to prevent the filling medium from being dissolved out of the groove structures 4 during machining. If mechanical sawing is employed, for example, a water-based cooling lubricant is generally employed. The filling medium should then be insoluble or very difficultly soluble in water. It has been shown in practice that, in view of the dimensions in the micrometer range, the choice of filling medium for the groove structures 4 results in a filling medium which can advantageously be used in liquid form for filling the groove structures 4.

According to one particularly preferred embodiment, however, the filling medium is present in a solid state of aggregation during mechanical machining. It is then ensured that the groove structures 4 are protected from contaminants. A solid state of aggregation of the filling medium can be achieved by the evaporation of a volatile solvent which may possibly be used, or by carrying out a chemical process. However, it is particularly advantageous if a temperature-dependent procedure is employed. It can then be ensured that, at the normal temperature which exists during mechanical machining, the filling medium exists in a solid state of aggregation, but that at a filling temperature which is considerably higher than the normal temperature, the groove structures 4 are filled by the filling medium in liquid form.

It is obvious that these temperatures, namely both the normal temperature and the filling temperature, are strongly dependent on the filling medium. The materials of the plates which are fixedly and two-dimensionally joined to each other also play a part, of course. It can generally be assumed, however, that the normal temperature ranges between about 2° C. and about 120° C., and that the filling temperature ranges between about 5° C. and about 280° C.

Normally, a filling medium will be used that is low in viscosity and/or has high volatility in order to allow processing at relatively low temperatures. However, a filling medium with higher viscosity can also be used with longer process periods and/or higher process temperatures.

The aforementioned requirements which are more generally imposed on the filling medium are achieved, for example, by mono- and polyalcohols, saturated and unsaturated fatty acids, esters of fatty acids and mixtures of these substances. Polyalcohols (synonymously called polyhydric, polyfunctional or polyhydroxylic alcohols) also include polyalkylene glycols, such as polyethylene glycols. Mono- or polyalcohols containing 10 to 30 C atoms, preferably from 12 to 24 C atoms, particularly from 16 to 20 C atoms, have proved to be of particular interest. The melting point of these chemicals is of an interesting order of magnitude, for example, about 60° C., and they also have a suitable boiling point of about 210° C., for example. They are preferably insoluble in water but are soluble in alcohol and ether, and therefore, are quite suitable for the process according to the invention. The choice of filling media which are used for each individual application is a question of the availability of these chemicals on the market. If an extended range of options is available, a particularly cost-effective, commercially available chemical will be selected.

Alternatively or additionally to the described chemical or temperature dependent methods, other phenomens can be used for filling. For example, there exist liquids (electroheological liquids) that change their consistency when applying an electrical voltage. Such liquids can be used for the described process, i.e., as a filling medium, as well.

The dimensions of the groove structures 4 in the micrometer range constitutes a problem for the filling of the groove structures 4 of the plates-shaped composite structure. Special filling techniques have to be taken into consideration here. According to the preferred teaching, and as has been proved to be particularly advantageous in practice, the composite structure is evacuated before the groove structures 4 are filled with the filling medium, and filling is carried out under vacuum, particularly at a residual pressure of less than about 250 mbar. The occurrence of gas bubble clusters in the groove structures 4 is thereby prevented.

It is also advantageous if the plate-shaped composite structure is brought back to normal pressure again after the groove structures 4 have been filled with the filling medium, and if solidification of the filling medium, which is initially liquid, occurs under normal pressure.

In practice, the plate-shaped composite structure is introduced as a whole into a receiver volume which is then evacuated down to the desired residual pressure. The plate-shaped composite structure is subsequently immersed, inclined in said volume, in a bath of the liquid filling medium until it is completely covered by the liquid filling medium. This occurs in the direction of the continuous joint between the groove structures 4, so that the level of filling medium inside the groove structures 4 slowly increases from one edge to the opposite edge until ultimately the entire plate-shaped composite structure, i.e., all the groove structures 4 situated therein, is/are completely filled with the filling medium.

Thereafter, the receiver volume is brought back to normal pressure again. The filling medium, which is still liquid, can thus remain in the groove structures 4 under its own surface tension, for which purpose the plate-shaped composite structure as a whole is brought into the horizontal. The temperature is then reduced so that the filling medium solidifies in the groove structures 4.

Following this, the plate-shaped composite structure containing the solidified filling medium is cut up by sawing it with a very high speed diamond circular saw along the lines 6, or is provided with the grooves 6' as shown in FIG. 2*c*. This is followed by the removal of the filling medium from the groove structures 4.

In similar arrangements, the filling medium can be filled into the groove structures 4 with or by pressure.

Just as particular considerations are required with regard to how the filling medium is introduced, preferably as a liquid, into the groove structures 4 before the separation operation proceeds, particular considerations are required with regard to how the filling medium situated in the groove structures 4 is removed again after mechanical machining. In this respect, it is recommended that the filling medium be removed from the groove structures 4 of the separated nozzle arrangements 1 with the temperature of the filling medium being increased. This can mean that the filling medium is evaporated from the groove structures 4 by an increase in temperature. In addition to increasing the temperature, this can be facilitated by making the ambient pressure low enough so that evaporation occurs more rapidly. As alternative to this, it has been shown in practice that the filling medium can be removed from the groove structures 4 of the separated nozzle arrangements 1 by dissolving the filling medium in a solvent and by sparging the filling medium/solvent mixture if necessary. These two methods can also be combined with each other.

An alcohol or an ether is recommended as a solvent for the filling media which were described in detail above and which can be used particularly advantageously. Low molecular alcohols or ethers are preferred, such as methanol, ethanol, propanol, isopropanol and/or diethylether. It is thus possible in practice to free the groove structures 4 completely from residues of filling medium, and to produce microfluidic arrangements with very low rejection rates.

In the above connection, it is also recommended, in order to prevent subsequent contamination of the groove structures 4, that the filling medium is not removed until cleaning has been carried out following mechanical machining, including the separation operation.

Figure 4:
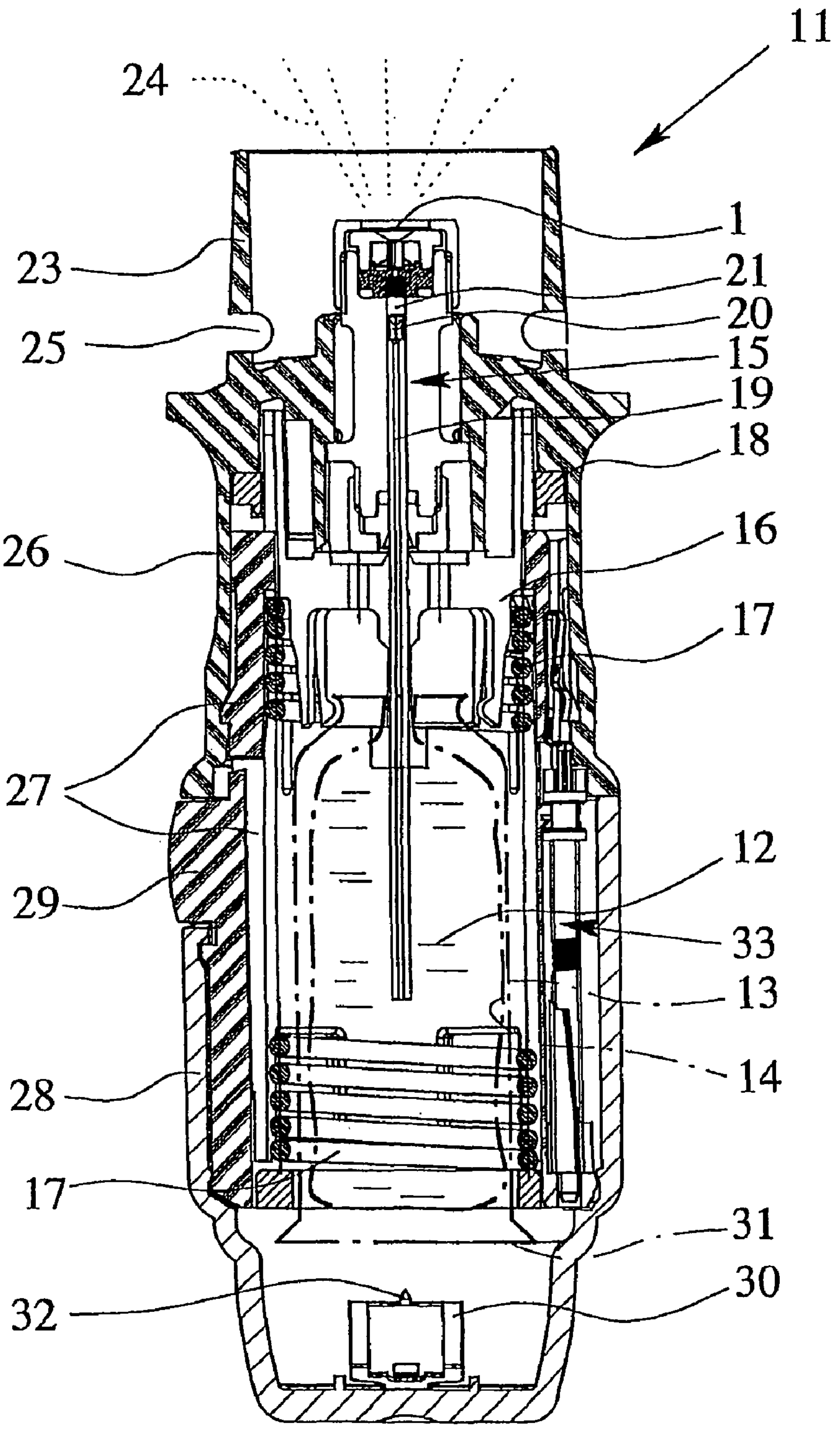
FIG. 4 is a schematic section through an atomiser according to the invention with a nozzle arrangement of this type in its untensioned state.
Figure 5:
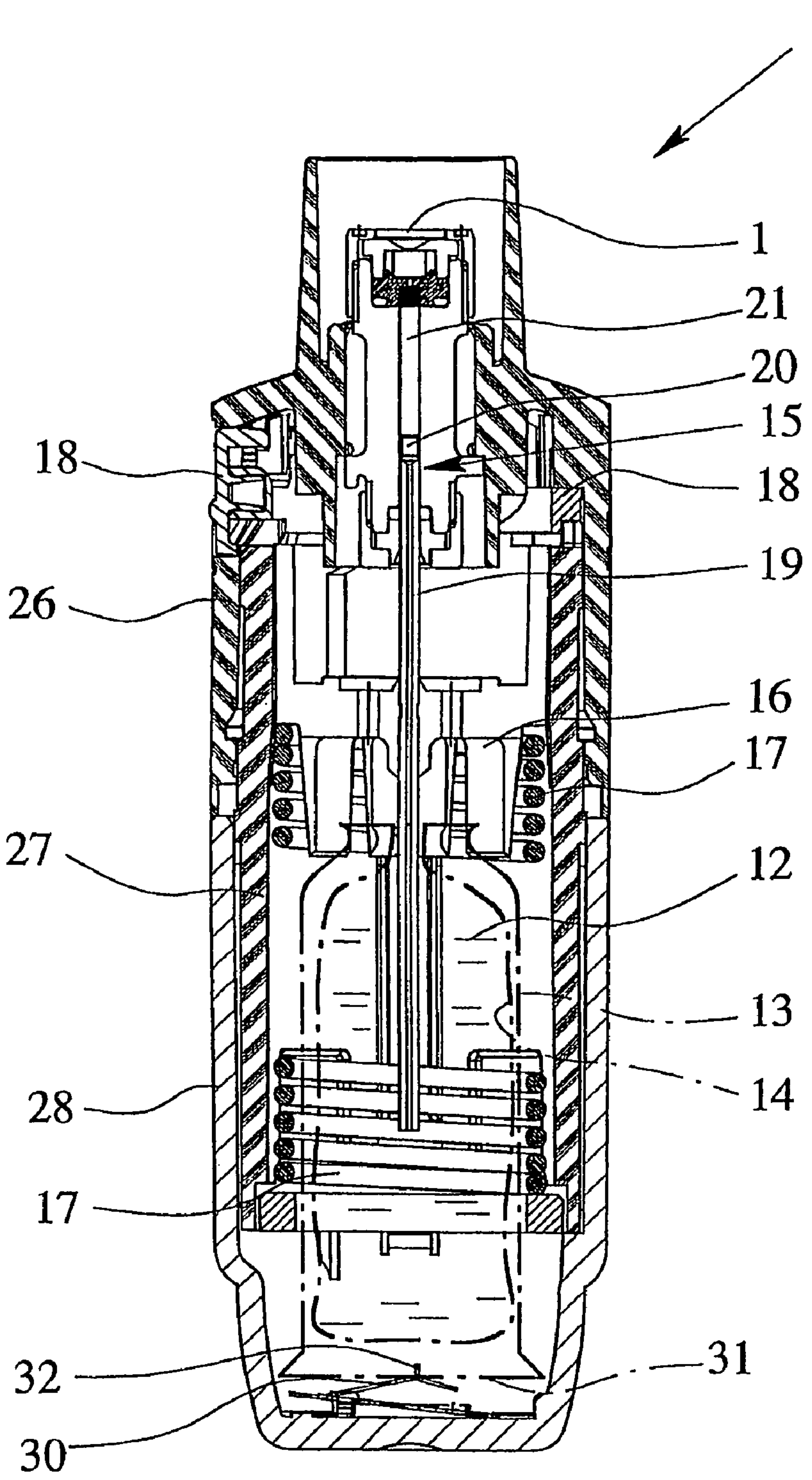
FIG. 5 is a schematic section, which is rotated by 90° in relation to FIG. 4, of the atomiser in its tensioned state.

FIGS. 4 and 5 are schematic illustrations of an atomiser 11 according to the invention which comprises the microfluidic arrangements or nozzle arrangement 1 according to the first or second embodiment for atomising a fluid 12, particularly a highly effective drug or the like, in its untensioned state (FIG. 4) and in its tensioned state (FIG. 5). In particular, the atomiser 11 is formed as a portable inhaler and preferably operates without a propellent gas.

On the atomisation of the fluid 12, which is preferably a liquid, particularly a drug, an aerosol is formed which can be breathed in or inhaled by a user, who is not illustrated. Inhalation is normally carried out at least once a day, particularly several times a day, preferably at predetermined time intervals.

The atomiser 11 comprises a suitable container 13, which is preferably replaceable, which comprises the fluid 12 and which forms a reservoir for the fluid 12 to be atomised. The container 13 preferably contains an amount of fluid which is sufficient for multiple applications, particularly for a predetermined period of application, such as one month, or for at least 50, preferably at least 100 doses or atomisations.

The container 13 is of substantially cylindrical or cartridge-like construction, and after the atomiser 11 has been opened can be inserted into the latter from below and can be replaced if necessary. It is preferably a rigid construction, particularly when the fluid 12 is contained in a bag 14 in the container 13.

The atomiser 11 comprises a pressure generator 15 for transporting and atomising the fluid 12, particularly in a predetermined dosage amount which is adjustable if necessary. The pressure generator 15 comprises a holder 16 for the container 13, an associated driving spring 17, only part of which is illustrated, with a locking element 18 which can be operated manually for unlocking, a feed tube 19 with a non-return valve 20 and a pressure chamber 21 in the region of a mouthpiece 13, which adjoins the nozzle arrangement 1 according to the invention.

When the driving spring 17 is axially tensioned, the holder 16, with the container 13 and the feed tube 19, is moved downwards as shown in the illustrations and fluid 12 is sucked out of the container 13 into the pressure chamber 21 of the pressure generator 15 via the non-return valve 20. Since the nozzle arrangement 1 has a very small flow across-section and is formed in particular as a capillary, a throttle effect is produced which is strong enough for the drawing in of air by suction at this point to be reliably prevented, even without the non-return valve.

On the subsequent release of tension after operating the locking element 18, the fluid 12 in the pressure chamber 21 is placed under pressure by the driving spring 17—namely by spring force—which moves the feed tube 19 upwards again, and is discharged via the nozzle arrangement 1, whereupon it is atomised, particularly into particles in the μm or nm range, preferably into particles of about 5 μm which can enter the lungs and which form a mist or jet of an aerosol 24 as indicated in FIG. 4. Therefore, the fluid 12 is preferably transported and atomised purely mechanically, particularly without a propellant gas and without electricity.

A user, who is not illustrated, can inhale the aerosol 24, whereupon additional air can be sucked into the mouthpiece 23 via at least one additional air opening 25.

The atomiser 11 has a housing upper part 26, and an inner part 27 which can rotate in relation thereto and to which a housing part 28, which in particular can be operated manually, can be detachably fastened, preferably by means of a holding element 29. The housing part 28 can be detached from the atomiser 11 to insert and/or to replace the container 13.

By manually rotating the housing part 28, the inner part 27 can be rotated in relation to the housing upper part 26, whereby the driving spring 17 can be tensioned via a drive (not illustrated) but which acts on the holder 16. When tensioning is effected, the container 13 is moved axially downwards until the container 13 assumes a final position in the tensioned state, as indicated in FIG. 5. During the atomisation operation, the container 13 is moved back again by the driving spring 17 into its initial position. The container 13 therefore executes a stroke movement during the tensioning operation and during the atomising operation.

The housing part 28 preferably forms a cap-like housing lower part and fits round or fits over a lower, free end region of the container 13. When the driving spring 17 is tensioned, the end region of the container 13 is moved (further) into the housing part 28 or towards the end face thereof, whereupon a spring 30 which acts axially and which is disposed in the housing part 28 comes into contact with the container base 31 and with a piercing element 32 opens the container 13, or a seal on the base on first contact, for venting.

The atomiser 11 comprises a monitoring device 33 which counts the number of operations of the atomiser 11, preferably by detecting a rotation of the inner part 27 in relation to the housing upper part 26. The monitoring device 33 operates purely mechanically in the embodiment illustrated.

The present invention therefore relates to atomisers 11 for inhalation purposes which produce a practically stationary aerosol mist or an aerosol mist with a velocity of emergence which is low enough for the propagation of the aerosol mist practically to come to a standstill after a few centimetres. The additional air stream is necessary in order to take in the aerosol 24 by inhalation.

In order to complete the disclosure of the present patent application, reference is made as a precaution to the complete contents of the disclosures of both International Patent Application Publications WO 91/1446 A1 and WO 97/12687 A1. In general, the disclosure there relates to an atomiser with a spring pressure of 5 to 60 MPa, preferably 10 to 50 MPa, on the fluid, with a volume per stroke of 10 to 50 μl, preferably 10 to 20 μl, most preferably about 15 μl per stroke, and particle sizes of up to 20 μm, preferably 3 to 10 μm. The disclosure there also preferably relates to an atomiser with a shape similar to that of a cylinder and a size of length about 9 cm to about 15 cm long and of width about 2 cm to about 5 cm, and with a nozzle jet spread of 20° to 160°, preferably of 80° to 100°. Values of this order are also applicable, as particularly preferred values, to the atomiser 11 according to the teaching of the present invention.

What is claimed is:

1. A process for producing a multiplicity of microfluidic arrangements from a plate-shaped composite structure comprised of two plates which are two-dimensionally and fixedly joined to each other and which have generally planar surfaces, and a multiplicity of recurring groove structures, the dimensions of which are within a micrometer range and which form flow channels disposed in a surface of at least one of the plates which is joined to a facing surface of the other of the plates, comprising the steps of:

producing the groove structures of the plate-shaped composite structure so that they are continuously joined to each other in at least one direction from one edge to an opposite edge of the plate-shaped composite structure, before mechanical machining, at least partially filling the groove structures of the plate-shaped composite structure with a filling medium such that at least openings or portions of the groove structures to be opened by mechanical machining are filled with the filling medium, the filling medium being selected so that it will not be removed from the groove structures either by the mechanical machining itself or by aids used during mechanical machining, wherein the plate-shaped composite structure is mechanically machined along lines which extend between the groove structures so that thereafter the microfluidic arrangements in the composite structure are individually or group-wise separated from each other, and removing the filling medium from the groove structures of the microfluidic arrangements after said mechanical machining.

2. A process according to claim 1, wherein said filling medium is at least one of immiscible with and not dissolved by a cooling lubricant used for said mechanical machining.

3. A process according to claim 1, wherein the filling medium is in liquid form during filling of the groove structures.

4. A process according to claim 1, wherein alcohols, mono- and polyhydric polyalcohols, fatty acids, saturated and unsaturated esters of fatty acids or a mixture of these substances are used as the filling medium.

5. A process according to claim 1, wherein the step of removing the filling medium from the groove structures is performed at an elevated temperature.

6. A process according to claim 1, wherein the filling medium is removed after the microfluidic arrangements have been cleaned following mechanical machining.

7. A process according to claim 1, wherein said mechanical machining forms grooves in the composite structure which cut through only one of the two plates.

8. A process according to claim 1, wherein the step of removing the filling medium from the groove structures is effected by dissolving the filling medium in a solvent and sparging the filling medium/solvent mixture.

9. A process according to claim 8, wherein an alcohol or an ether is used as the solvent.

10. A process according to claim 1, wherein a filling medium is used which is present in a solid state of aggregation during mechanical machining.

11. A process according to claim 10, wherein the filling medium is introduced into the groove structures at a temperature which is significantly higher than the normal temperature which is in a range of 2° C. to 120° C.

12. A process according to claim 10, wherein the filling medium is introduced into the groove structures at a temperature which is significantly higher than the normal temperature which is in a range between about 5° C. and about 280° C.

13. A process according to claim 1, wherein, before the filling medium is introduced into the groove structure, the composite structure is evacuated and filling is effected under vacuum.

14. A process according to claim 13, wherein said filling is effected at a residual pressure of less than about 250 mbar.

15. A process according to claim 14, wherein the filling medium is in liquid form during filling of the groove structures, and wherein, after the filling medium is introduced into the groove structure, the plate-shaped composite structure is brought to ambient pressure and the filling medium solidified.

* * * * *